US011339326B2

United States Patent
Rutstrom et al.

(10) Patent No.: US 11,339,326 B2
(45) Date of Patent: May 24, 2022

(54) TL+-BASED AND MIXED HALIDE A3B2X9-TYPE SCINTILLATORS (71) Applicant: University of Tennessee Research Foundation, Knoxville, TN (US)

(72) Inventors: Daniel Joseph Rutstrom, Knoxville, TN (US); Luis Stand, Knoxville, TN (US); Merry A. Koschan, Knoxville, TN (US); Mariya Zhuravleva, Knoxville, TN (US); Charles L. Melcher, Oak Ridge, TN (US)

(73) Assignee: University of Tennessee Research Foundation, Knoxville, TN (US)

( * ) Notice: Subject to any disclaimer, the term of this patent is extended or adjusted under 35 U.S.C. 154(b) by 0 days.

(21) Appl. No.: 17/156,124

(22) Filed: Jan. 22, 2021

(65) Prior Publication Data
US 2021/0253952 A1 Aug. 19, 2021

Related U.S. Application Data (60) Provisional application No. 62/965,292, filed on Jan. 24, 2020.

(51) Int. Cl.
*C09K 11/77* (2006.01)
*C01F 17/36* (2020.01)
*C30B 29/12* (2006.01)
*G01T 3/06* (2006.01)
*G01T 1/20* (2006.01)

(52) U.S. Cl.
CPC .......... *C09K 11/7773* (2013.01); *C01F 17/36* (2020.01); *C30B 29/12* (2013.01); *G01T 1/2018* (2013.01); *G01T 3/06* (2013.01); *C01P 2002/54* (2013.01); *C01P 2002/72* (2013.01); *C01P 2002/88* (2013.01)

(58) Field of Classification Search
None
See application file for complete search history.

(56) References Cited

U.S. PATENT DOCUMENTS

| | | | |
|---|---|---|---|
| 9,334,444 B1 * | 5/2016 | Yang | G01T 1/2006 |
| 9,624,429 B2 | 4/2017 | Stand et al. | |
| 9,695,356 B1 | 7/2017 | Stand et al. | |
| 10,221,355 B2 | 3/2019 | Stand et al. | |

(Continued)

OTHER PUBLICATIONS

Birowosuto et al., "Scintillation and luminescence properties of Ce3+ doped ternary cesium rare-earth halides." Physica Status Solidi A, vol. 204(3), pp. 850-860 (2007).

(Continued)

*Primary Examiner* — Edwin C Gunberg
(74) *Attorney, Agent, or Firm* — Jenkins, Wilson, Taylor & Hunt, P.A.

(57) ABSTRACT

Inorganic halides (e.g., inorganic halide scintillators) of the general formula $A_3B_2X_9$, including inorganic halides comprising thallium monovalent cations and/or combinations of different halides, are described. Radiation detectors including the inorganic halide scintillators and methods of using the detectors to detect high energy radiation are also described. In some cases, the scintillators can include a gadolinium cation, a boron cation, a lithium cation, a chloride ion, or combinations thereof and the scintillator can be used to detect neutrons.

28 Claims, 9 Drawing Sheets (56) References Cited

U.S. PATENT DOCUMENTS

| | | |
|---|---|---|
| 10,591,617 B2 | 3/2020 | Wu et al. |
| 10,838,083 B2 | 11/2020 | Wu et al. |
| 2015/0353822 A1 | 12/2015 | Tyagi et al. |
| 2016/0124094 A1 | 5/2016 | Melcher et al. |
| 2016/0168458 A1 | 6/2016 | Stand et al. |
| 2016/0291169 A1 | 10/2016 | Hawrami et al. |
| 2017/0190969 A1 | 7/2017 | Stand et al. |
| 2018/0105745 A1 | 4/2018 | Stand et al. |
| 2018/0155620 A1 | 6/2018 | Stand et al. |
| 2018/0321393 A1 | 11/2018 | Wu et al. |
| 2019/0250286 A1 | 8/2019 | Wu et al. |
| 2020/0318006 A1 | 10/2020 | Wu et al. |
| 2020/0362238 A1 | 11/2020 | Foster et al. |
| 2021/0270980 A1 | 9/2021 | Zhuravleva et al. |

OTHER PUBLICATIONS

Gaune-Escard et al., "Compound formation in lanthanide-alkali metal halide systems." Mineral Processing and Extractive Metallury (Trans. Inst. Min Metall. C), pp. 35-42 (2013).

Metallinou et al., "Thermal Analysis and Raman Spectroscopic Measurements on the Scandium Iodide-Cesium Iodide System." American Chemical Society, vol. 30(22), pp. 4260-4264 (1991).

Guthrie et al., "Metal-metal repulsion and bonding in confacial bioctahedra. The crystal structures of cesium yttrium iodide ($Cs_3Y_2I_9$) and cesium zirconium iodide ($Cs_3Zr_2I_9$) and comparison with related phases." Inorganic Chemistry, vol. 20(4), pp. 1192-1196 (1981).

\* cited by examiner

TL+-BASED AND MIXED HALIDE A3B2X9-TYPE SCINTILLATORS

RELATED APPLICATIONS

The presently disclosed subject matter claims the benefit of U.S. Provisional Patent Application Ser. No. 62/965,292, filed Jan. 24, 2020; the disclosure of which is incorporated herein by reference in its entirety.

GOVERNMENT INTEREST

This invention was made with government support under contracts DE-NA-0003180 and DOE-DE-NE0000094 awarded by the Department of Energy. The government has certain rights in the invention.

PARTIES TO A JOINT RESEARCH AGREEMENT

The subject matter disclosed herein was made by, on behalf of, and/or in connection with one or more of the following parties to a joint research agreement: Siemens Medical Solutions USA, Inc., and The University of Tennessee. The agreement was in effect on and before the effective filing date of the presently disclosed subject matter, and the presently disclosed subject matter was made as a result of activities undertaken within the scope of the agreement.

TECHNICAL FIELD

The presently disclosed subject matter relates to inorganic halide scintillator materials, such as those comprising monovalent thallium and/or mixed halides, and their use in optical and/or radiation detection applications.

Abbreviations

°=degree
Å=angstrom
° C.=degrees Celsius
%=percentage
µs=microsecond
Ce=cerium
CM=centimeter
Cs=cesium
DSC=differential scanning calorimetry
ER=energy resolution
eV=electronvolt
g=gram
h=hour
K=Kelvin
keV=kiloelectronvolt
mA=milliampere
MeV=megaelectronvolt
mg=milligram
min=minute
mm=millimeter
mol=mole
mW=milliwatts
nm=nanometers
ns=nanoseconds
ph=photon
PMT=photomultiplier tube
rad=radian
s=second
Sc=scandium
SiPM=silicon photomultiplier
Tl=thallium
Tm=melting temperature
wt=weight

BACKGROUND

Scintillator materials, which emit light pulses in response to impinging radiation, such as X-rays, gamma rays, and thermal neutron radiation, are used in detectors that have a wide range of applications in medical imaging, particle physics, geological exploration, security and other related areas. Considerations in selecting scintillator materials typically include, but are not limited to, luminosity, decay time, energy resolution, and emission wavelength.

While a variety of scintillator materials have been developed, there is an ongoing need to develop additional scintillator materials with improved properties for particular applications.

SUMMARY

This summary lists several embodiments of the presently disclosed subject matter, and in many cases lists variations and permutations of these embodiments. This summary is merely exemplary of the numerous and varied embodiments. Mention of one or more representative features of a given embodiment is likewise exemplary. Such an embodiment can typically exist with or without the feature(s) mentioned; likewise, those features can be applied to other embodiments of the presently disclosed subject matter, whether listed in this summary or not. To avoid excessive repetition, this Summary does not list or suggest all possible combinations of such features.

In some embodiments, the presently disclosed subject matter provides an inorganic halide having a composition of Formula (I):

$$A_3B_{2-i-z}X_9:D_iD'_z \qquad (I),$$

wherein: $0.0 \leq i \leq 2$; $0.0 \leq z \leq 2$; A is one or more monovalent cation of an element selected from the group comprising Tl, In, Li, Na, K, Rb, and Cs; B is one or more trivalent cation of an element selected from the group comprising Sc, Y, La, Ce, Pr, Nd, Pm, Sm, Eu, Gd, Tb, Dy, Ho, Er, Tm, Yb, Lu, boron, Bi and Sb; X is one or more halide selected from F, Cl, Br, and I; and D is a dopant and D' is a codopant, wherein each of D and D' are independently a cation of an element selected from the group comprising Mg, Ca, Sr, Ba, Zn, Zr, Hf, Sn, Au, Ag, Cu, Sc, Y, La, Ce, Pr, Nd, Pm, Sm, Eu, Gd, Tb, Dy, Ho, Er, Tm, Yb, Lu, boron, Bi and Sb, wherein D and D' are not the same cation and wherein D and D' are each different than B; and wherein A comprises or consists of $Tl^+$ and/or X comprises a combination of at least two different halides, or wherein the composition of Formula (I) has the formula $Cs_3Sc_{2-i}I_9:Ce_i$ or $Cs_3Sc_{2-i}I_9:Pr_i$.

In some embodiments, D is a trivalent cation of an element selected from the group comprising Sc, Y, La, Ce, Pr, Nd, Pm, Sm, Eu, Gd, Tb, Dy, Ho, Er, Tm, Yb, Lu, boron, Bi, and Sb. In some embodiments, $0.001 \leq i \leq 0.2$. In some embodiments, $z=0$.

In some embodiments, A comprises $Tl^+$ and the composition of Formula (I) has a composition of Formula (II):

$$A_{3-y}A'_yB_{2-i-z}X_{9-w}X'_w:D_iD'_z \qquad (II),$$

wherein: B, D, D', i and z are as defined for Formula (I); $0.0 \leq y \leq 2.99$; $0.0 \leq w \leq 8.99$; A is $Tl^+$; A' is a monovalent cation of an element selected from the group comprising In, Li, Na, K, Rb, and Cs; X is a halide selected from F, Cl, Br, and I; and X' is a halide selected from F, Cl, Br, and I, subject to the proviso that X' is a different halide than X.

In some embodiments, A is $Tl^+$, y=0, and the composition of Formula (II) is a composition of Formula (III):

$$Tl_3B_{2-i-z}X_{9-w}X'_w:D_iD'_z \qquad (III),$$

wherein B, X, X', D, D', i, z, and w are as defined for Formula (II). In some embodiments, B is $Sc^{3+}$. In some embodiments, D is $Ce^{3+}$ or $Pr^{3+}$. In some embodiments, i=0.04. In some embodiments, z is 0 and the inorganic halide is selected from the group comprising $Tl_3Sc_{2-i}I_9:Ce_i$, $Tl_3Sc_{2-i}I_9:Pr_i$, $Tl_3Sc_{2-i}Br_9:Ce_i$, $Tl_3Sc_{2-i}Cl_9:Ce_i$, $Tl_3Sc_{2-i}Br_{9-w}I_w:Ce_i$, and $Tl_3Sc_{2-i}Cl_{9-w}I_w:Ce_i$, wherein $0.001 \le i \le 0.2$ and $1 \le w \le 8$.

In some embodiments, X comprises two different halides selected from F, Cl, Br, and I and the composition of Formula (I) is a composition of Formula (IV):

$$AB_{2-i-z}X_{9-w}X'_w:D_iD'_z \qquad (IV),$$

wherein: A, B, X, D, D', i, and z are as defined for Formula (I); X' is a halide selected from F, Cl, Br, and I, subject to the proviso that X' is a different halide than X; and $1.0 \le w \le 8.0$. In some embodiments, A is $Cs^{3+}$. In some embodiments, B is $Sc^{2+}$.

In some embodiments, X and X' are each selected from Cl, Br, and I. In some embodiments, D is selected from $Ce^{3+}$ and $Pr^{3+}$. In some embodiments, z is 0 and the inorganic halide is selected from the group comprising $Cs_3Sc_{2-i}Br_{9-w}I_w:Ce_i$ and $Cs_3Sc_{2-i}Cl_{9-w}I_w:Ce_i$. In some embodiments, i=0.04.

In some embodiments, z is 0 and the inorganic halide is $Cs_3Sc_{2-i}I_9:Ce_i$, wherein $0.001 \le i \le 0.2$. In some embodiments, i=0.04.

In some embodiments, A comprises $Li^+$, the composition comprises a Gd cation, B comprises a trivalent boron cation; and/or X comprises Cl.

In some embodiments, the composition of Formula (I) is a single crystal.

In some embodiments, the presently disclosed subject matter provides a radiation detector comprising a photon detector and an inorganic halide having a composition of Formula (I):

$$A_3B_{2-i-z}X_9:D_iD'_z \qquad (I),$$

wherein: $0.0 \le i \le 2$; $0.0 \le z \le 2$; A is one or more monovalent cation of an element selected from the group comprising Tl, In, Li, Na, K, Rb, and Cs; B is one or more trivalent cation of an element selected from the group comprising Sc, Y, La, Ce, Pr, Nd, Pm, Sm, Eu, Gd, Tb, Dy, Ho, Er, Tm, Yb, Lu, boron, Bi and Sb; X is one or more halide selected from F, Cl, Br, and I; and D is a dopant and D' is a codopant, wherein each of D and D' are independently a cation of an element selected from the group comprising Mg, Ca, Sr, Ba, Zn, Zr, Hf, Sn, Au, Ag, Cu, Sc, Y, La, Ce, Pr, Nd, Pm, Sm, Eu, Gd, Tb, Dy, Ho, Er, Tm, Yb, Lu, boron, Bi and Sb, wherein D and D' are not the same cation and wherein D and D' are each different than B; and wherein A comprises or consists of $Tl^+$ and/or X comprises a combination of at least two different halides, or wherein the composition of Formula (I) has the formula $Cs_3Sc_{2-i}I_9:Ce_i$ or $Cs_3Sc_{2-i}I_9:Pr_i$. In some embodiments, the radiation detector is a medical diagnostic device, a device for oil exploration, a surveying device, or a device for container or baggage scanning.

In some embodiments, the presently disclosed subject matter provides a method of detecting gamma rays, X-rays, cosmic rays and/or particles having an energy of 1 keV or greater, the method comprising using a radiation detector comprising a photon detector and an inorganic halide having a composition of Formula (I):

$$A_3B_{2-i-z}X_9:D_iD'_z \qquad (I),$$

wherein: $0.0 \le i \le 2$; $0.0 \le z \le 2$; A is one or more monovalent cation of an element selected from the group comprising Tl, In, Li, Na, K, Rb, and Cs; B is one or more trivalent cation of an element selected from the group comprising Sc, Y, La, Ce, Pr, Nd, Pm, Sm, Eu, Gd, Tb, Dy, Ho, Er, Tm, Yb, Lu, boron, Bi and Sb; X is one or more halide selected from F, Cl, Br, and I; and D is a dopant and D' is a codopant, wherein each of D and D' are independently a cation of an element selected from the group comprising Mg, Ca, Sr, Ba, Zn, Zr, Hf, Sn, Au, Ag, Cu, Sc, Y, La, Ce, Pr, Nd, Pm, Sm, Eu, Gd, Tb, Dy, Ho, Er, Tm, Yb, Lu, boron, Bi and Sb, wherein D and D' are not the same cation and wherein D and D' are each different than B; and wherein A comprises or consists of $Tl^+$ and/or X comprises a combination of at least two different halides, or wherein the composition of Formula (I) has the formula $Cs_3Sc_{2-i}I_9:Ce_i$ or $Cs_3Sc_{2-i}I_9:Pr_i$.

In some embodiments, the presently disclosed subject matter provides a method of detecting neutrons, wherein the method comprising using a radiation detector comprising (i) a photon detector, and (ii) an inorganic halide having a composition of Formula (I):

$$A_3B_{2-i-z}X_9:D_iD'_z \qquad (I),$$

wherein: $0.0 \le i \le 2$; $0.0 \le z \le 2$; A is one or more monovalent cation of an element selected from Tl, In, Li, Na, K, Rb, and Cs; B is one or more trivalent cation of an element selected from the group comprising Sc, Y, La, Ce, Pr, Nd, Pm, Sm, Eu, Gd, Tb, Dy, Ho, Er, Tm, Yb, Lu, boron, Bi and Sb; X is one or more halide selected from F, Cl, Br, and I; and D is a dopant and D' is a codopant, wherein each of D and D' are independently a cation of an element selected from the group comprising Mg, Ca, Sr, Ba, Zn, Zr, Hf, Sn, Au, Ag, Cu, Sc, Y, La, Ce, Pr, Nd, Pm, Sm, Eu, Gd, Tb, Dy, Ho, Er, Tm, Yb, Lu, boron, Bi and Sb, wherein D and D' are not the same cation and wherein D and D' are each different than B; wherein A comprises or consists of $Tl^+$ and/or X comprises a combination of at least two different halides, or wherein the composition of Formula (I) has the formula $Cs_3Sc_{2-i}I_9$: $Ce_i$ or $Cs_3Sc_{2-i}I_9:Pr_i$; and wherein A comprises $Li^+$, the composition comprises a Gd cation, B comprises a trivalent boron cation; and/or X comprises Cl. In some embodiments, the radiation detector is a medical diagnostic device, a device for oil exploration, a surveying device, or a device for container or baggage scanning.

In some embodiments, the presently disclosed subject matter provides a method of preparing an inorganic halide having a composition of Formula (I):

$$A_3B_{2-i-z}X_9:D_iD'_z \qquad (I),$$

wherein: $0.0 \le i \le 2$; $0.0 \le z \le 2$; A is one or more monovalent cation of an element selected from the group comprising Tl, In, Li, Na, K, Rb, and Cs; B is one or more trivalent cation of an element selected from the group comprising Sc, Y, La, Ce, Pr, Nd, Pm, Sm, Eu, Gd, Tb, Dy, Ho, Er, Tm, Yb, Lu, boron, Bi and Sb; X is one or more halide selected from F, Cl, Br, and I; and D is a dopant and D' is a codopant, wherein each of D and D' are independently a cation of an element selected from the group comprising Mg, Ca, Sr, Ba, Zn, Zr, Hf, Sn, Au, Ag, Cu, Sc, Y, La, Ce, Pr, Nd, Pm, Sm, Eu, Gd, Tb, Dy, Ho, Er, Tm, Yb, Lu, boron, Bi and Sb, wherein D and D' are not the same cation and wherein D and D' are each different than B; and wherein A comprises or consists of $Tl^+$ and/or X comprises a combination of at least two different halides, or wherein the composition of Formula (I) has the formula $Cs_3Sc_{2-i}I_9$:$Ce_i$ or $Cs_3Sc_{2-i}I_9$:$Pr_i$; wherein the method comprises preparing a single crystal from molten raw materials. In some embodiments, the method comprises moving a crucible containing the molten raw materials vertically through a temperature gradient from a warmer region of a furnace to a cooler region of a furnace.

It is an object of the presently disclosed subject matter to provide inorganic halide compositions and related radiation detectors and methods. An object of the presently disclosed subject matter having been stated hereinabove, and which is achieved in whole or in part by the presently disclosed subject matter, other objects will become evident as the description proceeds when taken in connection with the accompanying drawings and examples as best described herein below.

DETAILED DESCRIPTION

The presently disclosed subject matter will now be described more fully. The presently disclosed subject matter can, however, be embodied in different forms and should not be construed as limited to the embodiments set forth herein below and in the accompanying Example. Rather, these embodiments are provided so that this disclosure will be thorough and complete, and will fully convey the scope of the embodiments to those skilled in the art.

All references listed herein, including but not limited to all patents, patent applications and publications thereof, and scientific journal articles, are incorporated herein by reference in their entireties to the extent that they supplement, explain, provide a background for, or teach methodology, techniques, and/or compositions employed herein.

I. Definitions

While the following terms are believed to be well understood by one of ordinary skill in the art, the following definitions are set forth to facilitate explanation of the presently disclosed subject matter.

Unless defined otherwise, all technical and scientific terms used herein have the same meaning as commonly understood to one of ordinary skill in the art to which the presently disclosed subject matter belongs.

Following long-standing patent law convention, the terms "a", "an", and "the" refer to "one or more" when used in this application.

The term "and/or" when used in describing two or more items or conditions, refers to situations where all named items or conditions are present or applicable, or to situations wherein only one (or less than all) of the items or conditions is present or applicable.

The use of the term "or" in the claims is used to mean "and/or" unless explicitly indicated to refer to alternatives only or the alternatives are mutually exclusive, although the disclosure supports a definition that refers to only alternatives and "and/or." As used herein "another" can mean at least a second or more.

The term "comprising", which is synonymous with "including," "containing," or "characterized by" is inclusive or open-ended and does not exclude additional, unrecited elements or method steps. "Comprising" is a term of art used in claim language which means that the named elements are essential, but other elements can be added and still form a construct within the scope of the claim.

As used herein, the phrase "consisting of" excludes any element, step, or ingredient not specified. When the phrase "consists of" appears in a clause of the body of a claim, rather than immediately following the preamble, it limits only the element set forth in that clause; other elements are not excluded from the claim as a whole.

As used herein, the phrase "consisting essentially of" limits the scope of a claim to the specified materials or steps, plus those that do not materially affect the basic and novel characteristic(s) of the claimed subject matter.

With respect to the terms "comprising", "consisting of", and "consisting essentially of", where one of these three terms is used herein, the presently disclosed and claimed subject matter can include the use of either of the other two terms.

Unless otherwise indicated, all numbers expressing quantities of time, temperature, light output, atomic (at) or mole (mol) percentage (%), and so forth used herein are to be understood as being modified in all instances by the term "about". Accordingly, unless indicated to the contrary, the numerical parameters set forth in this specification are approximations that can vary depending upon the desired properties sought to be obtained by the presently disclosed subject matter.

As used herein, the term "about", when referring to a value is meant to encompass variations of in one example ±20% or ±10%, in another example ±5%, in another example ±1%, and in still another example ±0.1% from the specified amount, as such variations are appropriate to perform the disclosed methods.

The term "scintillator" refers to a material that emits light (e.g., visible light) in response to stimulation by high energy radiation (e.g., X, α, β, or γ radiation).

The term "phosphor" as used herein refers to a material that emits light (e.g., visible light) in response to irradiation with electromagnetic or particle radiation.

In some embodiments, the compositional formula expression of an optical material (e.g., a scintillation material or a phosphor) can contain a colon wherein the composition of the main or base matrix material (e.g., the main $A_3B_2X_9$ matrix) is indicated on the left side of the colon, and the dopant (or activator ion) or the dopant ion and the codopant ion are indicated on the right side of the colon. In some embodiments, the dopant or the dopant and codopant can replace part of the trivalent B element or elements. For example, $Cs_3Sc_2I_9$:2Ce, $Cs_3Sc_2I_9$:2.0% Ce, $Cs_3Sc_2I_9$:Ce 2%, and $Cs_3Sc_2I_9$:$Ce^{3+}$ 2% each represent a cesium scandium halide optical material activated by cerium, wherein 2 mole % of the scandium is replaced by cerium.

The term "high energy radiation" can refer to electromagnetic radiation having energy higher than that of ultraviolet radiation, including, but not limited to X radiation (i.e., X-ray radiation), alpha (α) particles, gamma (γ) radiation, and beta (β) radiation. In some embodiments, the high energy radiation refers to gamma rays, cosmic rays, X-rays, and/or particles (e.g., neutrons) having an energy of 1 keV or greater. Scintillator materials as described herein can be used as components of radiation detectors in apparatuses such as counters, image intensifiers, and computed tomography (CT) scanners.

"Optical coupling" as used herein refers to a physical coupling between a scintillator and a photosensor, e.g., via the presence of optical grease or another optical coupling compound (or index matching compound) that bridges the gap between the scintillator and the photosensor. In addition to optical grease, optical coupling compounds can include, for example, liquids, oils and gels.

"Light output" can refer to the number of light photons produced per unit energy deposited, e.g., by a gamma ray being absorbed, typically the number of light photons/MeV.

As used herein, chemical ions can be represented simply by their chemical element symbols alone (e.g., Pr for praseodymium ion(s) (e.g., $Pr^{3+}$) or Cu for copper ion(s) (e.g., $Cu^+$ or $Cu^{2+}$)).

The term "rare earth element" as used herein refers to one or more elements selected from a lanthanide (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho) erbium (Er), thulium (Tm), ytterbium (Yb) and lutetium (Lu)), scandium (Sc), and yttrium (Y).

II. Inorganic Halide Scintillator Compositions

Although $A_3B_2X_9$-type compounds (e.g., Bi- or Sb-based $A_3B_2X_9$-type compounds) have been reported for use in photovoltaic applications, there are almost no reports of these materials being utilized in radiation detection instrumentation. However, these types of materials have been reported to have congruent melting (implying the ability to be grown from the melt as single crystals) and small electronic bandgaps (~2 eV to 4 eV). These properties can potentially lead to high light yields. Thus, according to one aspect of the presently disclosed subject matter, $A_3B_2X_9$-type inorganic halides (e.g., alkali-rare-earth halides) are prepared and used as materials for gamma spectroscopy and/or neutron detection applications.

More particularly, in some embodiments, $A_3B_2X_9$-type compounds are provided for use in optical and/or radiation detection applications. In some embodiments, A is one or more monovalent cations of an element or elements such as, but not limited to, thallium (Tl), indium (In), lithium (Li), sodium (Na), potassium (K), rubidium (Rb), and/or cesium (Cs). In some embodiments, B is one or more trivalent cations of an element or elements such as, but not limited to, scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), boron (B), bismuth (Bi), and/or antimony (Sb). In some embodiments, X is one or more anions of a halogen group element, such as fluorine (F), chlorine (Cl), bromine (Br), and/or iodine (I). In some embodiments, the compound can also include one or more dopants, such as a single dopant or a dopant and a codopant.

For instance, in some embodiments, the presently disclosed subject matter provides a composition having one of the following exemplary formulae:

(1) $A_{3-y}A'_yB_2X_9$ (wherein A=Tl and A' is a different monovalent cation with $0 \leq y \leq 3$);

(2) $A_3B_2X_{9-w}X'_w$ (wherein X and X' are two different halogen ions with $0 \leq w \leq 9$);

(3) $A_{3-y}A'_yB_2X_{9-w}X'_w$ (wherein A and A' are two different monovalent cations, and X and X' are two different halogen ions);

(4) $A_{3-y}A'_yB_{2-i}X_{9-w}X'_w:D_i$ (wherein D is a dopant selected from those listed as B with A and A' are two different monovalent cations, and X and X' are two different halogen ions); and (5) $A_{3-y}A'_yB_{2-i}X_{9-w}X'_w:D_i$ (wherein A is Tl and A' is Cs or Li, X and X' are two different halogen ions, optionally Cl and Br, B is a mixture of at least two different trivalent cations, and the material is optionally doped with a dopant D selected from those listed as B (e.g., Ce or Pr) or combinations thereof, wherein $0 \leq i \leq 2$, optionally $0 \leq i \leq 0.2$).

The presently disclosed subject matter differs from previously described inorganic halide scintillators in that Tl can occupy the A site (either partially or fully) of the $A_3B_2X_9$ base matrix material of the composition as a monovalent ion. In contrast, for example, U.S. Pat. No. 9,334,444 describes Tl as a potential dopant, D, that can replace the B element of an $A_3B_2X_9$ base matrix material formula. Substitution of Tl for a B element results in Tl being incorporated in its trivalent state ($Tl^{3+}$). This results in a significant compositional difference between the presently disclosed compounds (e.g., $Tl^+_3B^{3+}_{2-i}X^-_9:D^{3+}_i$) and the inorganic halides of U.S. Pat. No. 9,334,444 (e.g., $A^+_3Tl^{3+}_{2-i}X^-_9:D^{3+}_i$) that can lead to changes in scintillation properties. In addition, U.S. Pat. No. 9,334,444 does not describe compounds in which more than one halogen ion is incorporated simultaneously, referred to herein as "mixed halide" compounds. The mixed halide approach presented herein can allow for fine-tuning of the luminescent and scintillation properties, such as a shift in emission wavelengths that are better suited for detection with a photomultiplier tube (PMT) or silicon photomultiplier (SiPM). U.S. Patent Application Publication No. 2016/0291169 describes Tl-based halide scintillators; however, the compositions described therein do not include those of the $A_3B_2X_9$ type. Thus, it is believed that the presently disclosed subject matter provides the first description of $Tl_3B_2X_9$ and $A_3B_2X_{9-w}X'_w$ scintillators.

In some embodiments, the presently disclosed subject matter provides an inorganic halide having a composition of Formula (I):

$$A_3B_{2-i-z}X_9:D_iD'_z \qquad (I),$$

wherein $0.0 \leq i \leq 2$; $0.0 \leq z \leq 2$; A is one or more monovalent cation (e.g., of an element selected from the group including Tl, In, Li, Na, K, Rb, and Cs); B is one or more trivalent cation (e.g., of an element selected from the group comprising Sc, Y, La, Ce, Pr, Nd, Pm, Sm, Eu, Gd, Tb, Dy, Ho, Er, Tm, Yb, Lu, boron, Bi and Sb); X is one or more halide (i.e., one or more of F, Cl, Br, and I); D is a dopant and D' is a codopant; wherein D and D' are different from each other and are each different than any trivalent cation included as B; and subject to the proviso that: (i) A comprises or consists of $Tl^+$ and/or (ii) X comprises a combination of at least two different halides (i.e., the inorganic halide is a mixed halide); or subject to the proviso that (iii) the inorganic halide is a Ce- or Pr-doped cesium scandium iodide (i.e., has the formula $Cs_3Sc_{2-i}I_9:Ce_i$ or $Cs_3Sc_{2-i}I_9:Pr_i$). In some embodiments, the composition of Formula (I) is a phosphor and/or a scintillator.

Suitable dopants and/or codopants include, but are not limited to, cations of alkaline earth metals, transition metals, and lanthanides. In some embodiments, D and D' are each cations (e.g., divalent or trivalent cations) of an element selected from the group comprising magnesium (Mg), calcium (Ca), strontium (Sr), barium (Ba), zinc (Zn), zirconium (Zr), hafnium (Hf), tin (Sn), gold (Au), silver (Ag), copper (Cu), Sc, Y, La, Ce, Pr, Nd, Pm, Sm, Eu, Gd, Tb, Dy, Ho, Er, Tm, Yb, Lu, boron, Bi and Sb. In some embodiments, D and/or D' is a divalent cation (e.g., of an element selected from the group comprising Mg, Ca, Sr, Ba, Zn, Zr, Hf, Sn, Au, Ag, Cu, Yb, Eu, and Sm). In some embodiments, D and/or D' is a trivalent cation. In some embodiments, D and/or D' is a trivalent cation of an element selected from the group comprising Sc, Y, La, Ce, Pr, Nd, Pm, Sm, Eu, Gd, Tb, Dy, Ho, Er, Tm, Yb, Lu, boron, Bi and Sb. In some embodiments, D is a trivalent cation (e.g., of Ce or Pr) and D' is a divalent cation (e.g., of Ca or Sr).

In some embodiments, A comprises or consists of $Tl^+$. In some embodiments, X comprises a combination of at least two different halides. In some embodiments, A comprises or consists of $Tl^+$ and X comprises a combination of at least two different halides (e.g., I and Br, I and Cl, or Br and Cl).

In some embodiments, $0.001 \leq i \leq 0.2$. Thus, in some embodiments, the composition of Formula (I) comprises between about 0.05 mole % and about 10 mole % of D. In some embodiments, $0.004 \leq i \leq 0.1$. In some embodiments, i is about 0.004, 0.006, 0.008, 0.01, 0.02, 0.03, 0.04, 0.05, 0.06, 0.07, 0.08, 0.09, or about 0.1. In some embodiments, i is about 0.04 (i.e., the composition comprises about 2 mole % of D). In some embodiments, D is $Ce^{3+}$ or $Pr^{3+}$.

In some embodiments, $0.001 \leq z \leq 0.2$. Thus, in some embodiments, the composition of Formula (I) comprises between about 0.05 mole % and about 10 mole % of D'. In some embodiments, $0.004 \leq z \leq 0.1$. In some embodiments, z is about 0.004, 0.006, 0.008, 0.01, 0.02, 0.03, 0.04, 0.05, 0.06, 0.07, 0.08, 0.09, or about 0.1. In some embodiments, D' is $Sr^{2+}$ or $Ca^{2+}$. In some embodiments, z is 0 and D' is absent.

In some embodiments, the composition of Formula (I) is a $Tl^+$-based inorganic halide (e.g., a $Tl^+$-based inorganic halide scintillator and/or phosphor). Thus, in some embodiments, A in Formula (I) comprises $Tl^+$ and the inorganic halide having a composition of Formula (I) has a composition of Formula (II):

$$A_{3-y}A'_yB_{2-i-z}X_{9-w}X'_w:D_iD'_z \qquad (II),$$

wherein: B, D, D', i, and z are as defined for Formula (I); $0.0 \leq y \leq 2.99$; $0.0 \leq w \leq 8.99$; A is $Tl^+$; A' is a monovalent cation of an element selected from the group comprising In, Li, Na, K, Rb, and Cs; X is a halide selected from F, Cl, Br, and I; and X' is a halide selected from F, Cl, Br, and I, subject to the proviso that X' is a different halide than X. In some embodiments, X and X' are each selected from Cl, Br, and I.

In some embodiments, y=0 (i.e., the composition of Formula (II) comprises no A'). Thus, in some embodiments, the inorganic halide having a composition of Formula (II) is an inorganic halide having a composition of Formula (III):

$$Tl_3B_{2-i-z}X_{9-w}X'_w:D_iD'_z \qquad (III),$$

wherein B, X, X', D, D', i, z, and w are as defined for Formula (II).

In some embodiments, B comprises or consists of $Sc^{3+}$.

In some embodiments, D is a trivalent cation. In some embodiments, D is $Ce^{3+}$ or $Pr^{3+}$. In some embodiments, $0.004 \leq i \leq 0.1$. In some embodiments, i=0.04.

In some embodiments, the inorganic halide having a composition of Formula (III) is a thallium scandium halide. In some embodiments, z is 0 and the composition of Formula (III) is selected from the group comprising $Tl_3Sc_{2-i}I_9:Ce_i$, $Tl_3Sc_{2-i}I_9:Pr_i$, $Tl_3Sc_{2-i}Br_9:Ce_i$, $Tl_3Sc_{2-i}Cl_9:Ce_i$, $Tl_3Sc_{2-i}Br_{9-w}I_w:Ce_i$, and $Tl_3Sc_{2-i}Cl_{9-w}I_w:Ce_i$, wherein $0.001 \leq i \leq 0.2$ (e.g., 0.01, 0.02, 0.04, 0.06, 0.08, 0.10, 0.12, 0.14, 0.16, 0.18, or 0.20) and $1 \leq w \leq 8$ (e.g., 1, 2, 3, 4, 5, 6, 7, or 8). In some embodiments, w is 1.

In some embodiments, X comprises two different halides selected from F, Cl, Br, and I and the inorganic halide having a composition of Formula (I) is an inorganic halide having a composition of Formula (IV):

$$AB_{2-i-z}X_{9-w}X'_w:D_iD'_z \qquad (IV),$$

wherein A, B, X, D, D', i, and z are as defined for Formula (I); X' is a halide selected from F, Cl, Br, and I, subject to the proviso that X' is a different halide than X; and $1.0 \leq w \leq 8.0$ (e.g., 1, 2, 3, 4, 5, 6, 7, or 8). In some embodiments, A comprises or consists of $Cs^{3+}$. In some embodiments, B comprises or consists of $Sc^{2+}$. In some embodiments, X and X' are each selected from Cl, Br, and I. In some embodiments, $0.004 \leq i \leq 0.1$. In some embodiments, i is 0.04. In some embodiments, D is selected from $Ce^{3+}$ and $Pr^{3+}$. In some embodiments, z is 0. In some embodiments, the composition of Formula (IV) is selected from $Cs_3Sc_{2-i}Br_{9-w}I_w:Ce_i$ and $Cs_3Sc_{2-i}Cl_{9-w}I_w:Ce_i$. In some embodiments, the composition of Formula (IV) is selected from $Cs_3Sc_{2-i}Br_{9-w}I_w:Pr_i$ and $Cs_3Sc_{2-i}Cl_{9-w}I_w:Pr_i$.

In some embodiments, z is 0 and the composition of Formula (I) is $Cs_3Sc_{2-i}I_9:Ce_i$ or $Cs_3Sc_{2-i}I_9:Pr_i$, wherein $0.001 \leq i \leq 0.2$. In some embodiments, $0.004 \leq i \leq 0.1$. In some embodiments, i=0.04. Thus, in some embodiments, the composition of Formula (I) is $Cs_3Sc_2I_9$:Ce 2% or $Cs_3Sc_2I_9$:Pr 2%.

In some embodiments, the presently disclosed inorganic halide composition comprises at least one ion of an element selected from Li, Gd, boron, or Cl. In some embodiments, the composition comprises a combination of ions of two, three or four of Li, Gd, boron and Cl. Thus, for instance, in some embodiments, in the compound having a composition of Formula (I) or (IV), A comprises or consists of $Li^+$. In some embodiments, in the compound of Formula (II), A' is Li$^+$. In some embodiments, in the compound having a composition of Formula (I), (II), (III) or (IV), B comprises or consists of Gd$^{3+}$ or a trivalent boron cation and/or X comprises or consists of Cl. In some embodiments, D or D' is Gd$^{3+}$. In some embodiments, the Li monovalent ion, if present, comprises a Li isotope, e.g., a lithium-6 isotope. Accordingly, in some embodiments, A comprises Li$^+$, the composition comprises a Gd cation, B comprises a trivalent boron cation; and/or X comprises Cl.

The composition of the presently disclosed subject matter (e.g., of Formulas (I), (II), (III), or (IV)) can be a single crystal, a polycrystalline material, and/or a ceramic. In some embodiments, the composition is a single crystal. By "single crystal" is meant a material manufactured by a liquid phase method having few or no grain boundaries and wherein each adjoining crystal grain generally has the same orientation. In some embodiments, the composition has a hexagonal crystal structure. In some embodiments, the hexagonal crystal structure belongs to the space group P63/mmc. In some embodiments, the material can be polycrystalline and/or ceramic, and can contain crystals of varying size and/or orientation.

III. Radiation Detectors, Related Devices and Methods

In some embodiments, the presently disclosed subject matter provides a radiation detector comprising, consisting essentially of, or consisting of an inorganic halide (i.e., an inorganic halide scintillator and/or phosphor) of the presently disclosed subject matter (e.g., a composition of Formula (I), (II), (III), or (IV) as described hereinabove or a mixture of such materials). The radiation detector can comprise the inorganic halide scintillator (which absorbs radiation and emits light) and a photodetector (which detects said emitted light). The photodetector can be any suitable detector or detectors and can be or not be optically coupled to the scintillator material for producing an electrical signal in response to emission of light from the scintillator material. Thus, the photodetector can be configured to convert photons to an electrical signal. For example, a signal amplifier can be provided to convert an output signal from a photodiode into a voltage signal. The signal amplifier can also be designed to amplify the voltage signal. Electronics associated with the photodetector can be used to shape and digitize the electronic signal.

Figure 8:
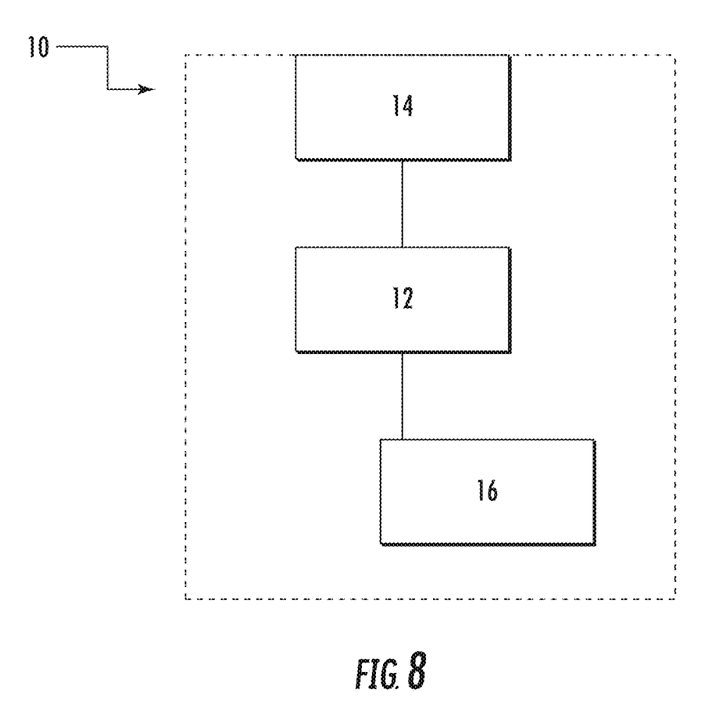
FIG. 8 is a schematic drawing of an apparatus for detecting radiation according to an aspect of the presently disclosed subject matter. Apparatus 10 includes photon detector 12 optically coupled to scintillator material 14. Apparatus 10 can optionally include electronics 16 for recording and/or displaying electronic signal from photon detector 12. Thus, optional electronics 16 can be in electronic communication with photon detector 12.

Referring now to FIG. 8, in some embodiments, the presently disclosed subject matter provides an apparatus 10 for detecting radiation wherein the apparatus comprises a photon detector 12 and a scintillator material 14 (e.g., an inorganic halide scintillator material). Scintillator material 14 can convert radiation to light that can be collected by a charge-coupled device (CCD) or a photomultiplier tube (PMT) or other photon detector 12 efficiently and at a fast rate.

Referring again to FIG. 8, photon detector 12 can be any suitable detector or detectors and can be optically coupled (e.g., via optical grease or another optical coupling compound, such as an optical coupling oil or liquid) to the scintillator (e.g., an inorganic halide scintillator material) for producing an electrical signal in response to emission of light from the scintillator. Thus, photon detector 12 can be configured to convert photons to an electrical signal. Electronics associated with photon detector 12 can be used to shape and digitize the electronic signal. Suitable photon detectors 12 include, but are not limited to, photomultiplier tubes, photodiodes, CCD sensors, and image intensifiers. Apparatus 10 can also include electronics 16 for recording and/or displaying the electronic signal.

In some embodiments, the radiation detector is configured for use as part of a medical or veterinary diagnostic device, a device for oil or other geological exploration (e.g., oil well logging probes), a device or instrument for surveying or as a device for security and/or military-related purposes (e.g., as a device for container, vehicle, or baggage scanning or for scanning humans or other animals). In some embodiments, the medical or veterinary diagnostic device is selected from, but not limited to, a positron emission tomography (PET) device, an X-ray computed tomography (CT) device, a single photon emission computed tomography (SPECT) device, or a planar nuclear medical imaging device. For example, the radiation detector can be configured to move (e.g., via mechanical and/or electronic controls) over and/or around a sample, such as a human or animal subject, such that it can detect radiation emitted from any desired site or sites on the sample. In some embodiments, the detector can be set or mounted on a rotating body to rotate the detector around a sample.

In some embodiments, the device can also include a radiation source. For instance, an X-ray CT device of the presently disclosed subject matter can include an X-ray source for radiating X-rays and a detector for detecting said X-rays. In some embodiments, the device can comprise a plurality of radiation detectors. The plurality of radiation detectors can be arranged, for example, in a cylindrical or other desired shape, for detecting radiation emitted from various positions on the surface of a sample.

In some embodiments, the presently disclosed subject matter provides a method for detecting radiation (or the absence of radiation) using a radiation detector comprising an inorganic halide scintillator as described hereinabove (e.g., an inorganic halide scintillator of Formula (I), (II), (III), or (IV)). Thus, in some embodiments, the presently disclosed subject matter provides a method of detecting gamma rays, X-rays, cosmic rays and particles having an energy of 1 keV or greater, wherein the method comprises using a radiation detector comprising a scintillator material comprising a composition of one of Formulas (I), (II), (III) or (IV).

In some embodiments, the inorganic halide scintillator material comprises an ion or ion of one or more elements selected from Li (e.g., at an A site in the formula $A_3B_2X_9$), Gd or boron (e.g., at a B site in the base formula $A_3B_2X_9$ or as a dopant or codopant), or Cl (at an X site in the formula $A_3B_2X_9$). In some embodiments, the presently disclosed subject matter provides a method for detecting neutrons using a radiation detector comprising a scintillation material of Formula (I) that comprises one or more ion of an element selected from Li, Gd, boron and Cl. Radiation detectors that can detect neutrons can be used, for example, to measure power in nuclear or research reactors; as research instruments in the fields of materials science, plasma physics, and particle physics; and to detect cosmic rays and/or special nuclear materials. In some embodiments, the radiation detector can be a medical diagnostic device, a device for oil exploration, a surveying device, or a device for container or baggage scanning. In some embodiments, the radiation detector can be a scientific research device.

In some embodiments, the presently disclosed methods can comprise providing a radiation detector comprising a photodetector and a scintillator material of the presently disclosed subject matter; positioning the detector, wherein the positioning comprises placing the detector in a location wherein the scintillator material is in the path of a beam of radiation (or the suspected path of a beam of radiation); and detecting light (or detecting the absence of light) emitted by the scintillator material with the photodetector. Detecting the light emitted by the scintillator material can comprise converting photons to an electrical signal. Detecting can also comprise processing the electrical signal to shape, digitize, or amplify the signal. The method can further comprise displaying the electrical signal or processed electrical signal.

IV. Methods of Preparation

The presently disclosed inorganic halide compositions can be prepared via any suitable method as would be apparent to one of ordinary skill in the art upon a review of the instant disclosure. In some embodiments, the presently disclosed subject matter provides a method of preparing an undoped, doped, or codoped inorganic halide scintillator material of one of Formulas (I), (II), (III), or (IV). In some embodiments, the method comprises preparing a crystal (e.g., a single crystal) from a melt (i.e., a mixture of molten raw materials). For instance, in some embodiments, the composition can be prepared by the Bridgman method (e.g., the vertical Bridgman or Bridgman-Stockbarger method), wherein a crucible or ampoule containing a melt of the molten raw materials is pulled through a temperature gradient in a furnace from a warmer region of the furnace to a cooler region, causing the molten raw materials to slowly cool and a crystal or crystals to form. However, single crystals or polycrystalline materials and/or ceramics grown or produced by other methods can also be used as a scintillator material according to the present disclosure. For example, alternative methods for producing the presently disclosed compositions include, but are not limited to the micro-pulling down method, the Czochralski (pulling-up) method, zone melt method, Edge-defined Film-fed Growth (EFG) method, and hot isostatic press (HIP) sintering method.

Raw materials (i.e., "starting materials") can include halides, such as CsI, $ScI_3$, $CeI_3$, etc. In some embodiments, the starting materials include a $^6$Li enriched lithium compound. When the composition is used as a crystal for a scintillator, a high-purity raw material (e.g., having a purity of 99.99% or higher and/or not containing more than 1 ppm of an impurity) can be used. These starting materials can be weighed and mixed such that a desired composition is obtained at the time of forming a melt.

In some embodiments, the raw materials can be measured out and mixed, e.g., using a ball mill, etc., and the mixed powder heated to a temperature above the melting temperature of the raw material with the highest melting temperature to provide a homogenous mixture of raw materials and cooled.

In some embodiments, the presently disclosed materials can be provided as ceramics, for example, by using a hot press or hot isotatic press (HIP) method.

In some embodiments, the method further comprises annealing the scintillator material for a period of time (e.g., between a few hours and a few days). The annealing can be performed, for example, under vacuum, in nitrogen, or a mixture of nitrogen and hydrogen. The annealing can be done at any suitable temperature that is lower than the melting point of the material, e.g., between about 100 and about 800 degrees Celsius (e.g., about 100, 200, 300, 400, 500, 600, 700, or about 800 degrees Celsius). In some embodiments, the annealing increases the light yield of the material and/or provides a material with a faster scintillation decay time. In some embodiments, the annealing is performed under vacuum. In some embodiments, the annealing is performed at a temperature of about 500° C. and/or for a time period of about 48 hours.

EXAMPLES

The following examples are included to further illustrate various embodiments of the presently disclosed subject matter. However, those of ordinary skill in the art should, in light of the present disclosure, appreciate that many changes can be made in the specific embodiments which are disclosed and still obtain a like or similar result without departing from the spirit and scope of the presently disclosed subject matter.

Example 1

$Cs_3Sc_2I_9$:Ce

Figure 1A:
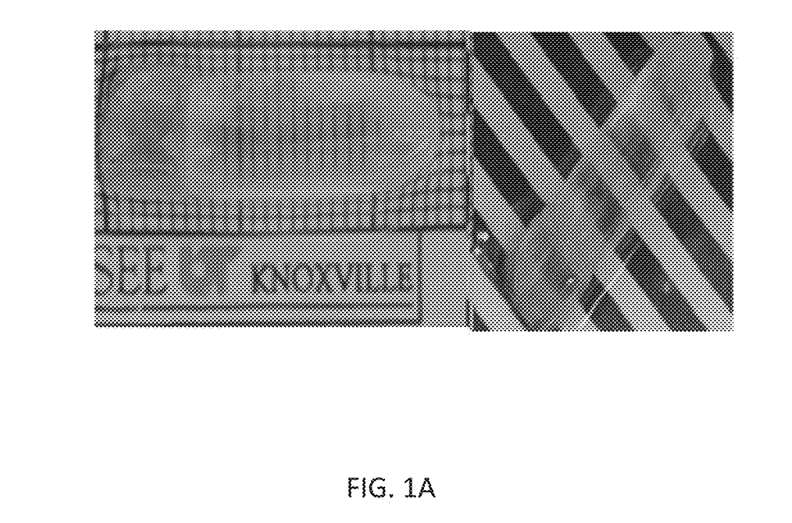
FIG. 1A is a pair of photographs of grown crystals of undoped cesium scandium iodide ($Cs_3Sc_2I_9$).
Figure 1B:
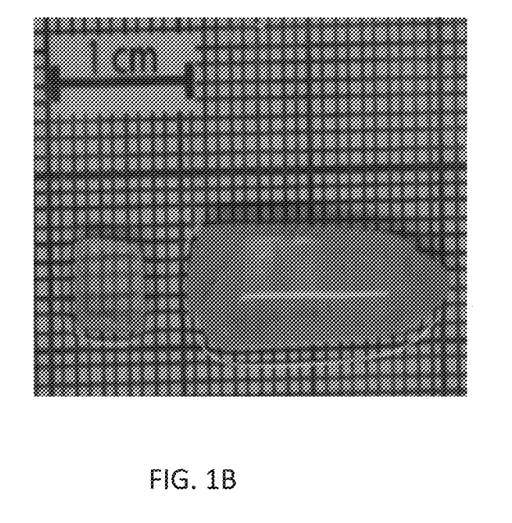
FIG. 1B is a photograph of a grown crystal of cerium-doped cesium scandium iodide ($Cs_3Sc_2I_9$:Ce 2%).

Single crystals of undoped $Cs_3Sc_2I_9$ and $Cs_3Sc_2I_9$:Ce 2% were grown from the melt using the vertical Bridgman technique. See FIGS. 1A and 1B. Crystals were grown in Ø7 mm bent-capillary quartz ampoules. Prior to growth, raw materials were melt-synthesized by heating to a temperature above the melting points of the constituent compounds, soaking for >12 hours, and cooling to room temperature over several hours. This was done to ensure that thorough mixing was achieved. Prior to synthesis, raw materials in the form of anhydrous beads or polycrystalline flakes of CsI, $ScI_3$, and $CeI_3$ were loaded into the quartz ampoules in stoichiometric amounts. The loaded ampoules were then evacuated to a pressure <$10^{-6}$ Torr, dried at 250° C. for >12 hours, and cooled to room temperature. The ampoules were then sealed under vacuum using a $H_2$—$O_2$ torch. Crystals were grown in a Bridgman furnace with the hot zone(s) set to 750° C. and cold zone(s) set to 550° C. The thermal gradient was ~50° C./cm, the translation rate was 0.8 mm/hr, and the cooling rate was 5-10° C./hr.

Powder X-ray diffraction data was collected under ambient conditions using a PANalytical Empyrean diffractometer (Malvern Panalytical Ltd., Malvern, United Kingdom) with the Bragg-Brentano geometry and theta-theta goniometer. X-rays were generated with a Cu Kα source operated at 45 kilovolts (kV) and 40 milliampere (mA). The incident beam passed through a 0.02 radian (rad) Soller slit followed by a ⅛° programmable divergence slit, 10 millimeter (mm) mask, and ¼° anti-scatter slit. Diffracted beam optics consisted of a 0.02 rad Soller slit, Ni-beta filter, and a PIXcel3D-Medipix 3 detector (Malvern Panalytical Ltd., Malvern, United Kingdom) with a ⅛° programmable anti-scatter slit. The General Structure Analysis System (GSASII; Los Alamos National Laboratory) was used for the Rietveld refinement and determination of lattice parameters. The imported phase was obtained as described in Guthrie et al. (Inorganic Chemistry, 1981, 20(4), 1192-1196). Differential scanning calorimetry (DSC) was measured using a Setaram Labsys Evo instrument (Setaram, Cranbury, N.J., United States of America). The measurement was performed with the sample inside of a quartz crucible that was sealed under vacuum. The sample was heated at 5 K/min to 715° C. and cooled at 5 K/min to room temperature.

Luminescence and scintillation measurements were conducted with the samples submerged in mineral oil to prevent degradation due to their sensitivity to air and moisture. Steady-state photoluminescence (PL) spectra were measured using a Horiba Jobin Yvon Fluorolog 3 spectrofluorometer (Horiba, Kyoto, Japan) equipped with a Xe lamp and dual scanning Monochromators. Emission spectra were collected using excitation wavelengths of 274 nm and 455 nm, and The PL lifetime was measured using Horiba Jobin Yvon NanoLed light source (Horiba, Kyoto, Japan) with an excitation wavelength of 265 nm while monitoring emission at 610 nm. Radioluminescence (RL) was measured under excitation by a Cu target X-ray tube operated at 35 kV and 0.1 mA. The resulting emission spectra were collected from 200 nm to 800 nm with a 150 mm focal length monochromator.

Energy resolution was measured using a 662 keV $^{137}$Cs source. The measurements were conducted with the crystals placed in a quartz housing filled with mineral oil, which was optically coupled to a Hamamatsu R6231 PMT (Hamamatsu Photonics K. K., Hamamatsu City, Japan). The housing and PMT were covered with reflective Teflon sheets to maximize light collection. Pulse height spectra were collected with the PMT operated at 1 kV using a signal processing chain comprising a Canberra 2005 preamplifier (Canberra Industries, Inc., Meridan, Conn., U.S.), an Ortec 672 amplifier (Advanced Measurement Technology, Inc., Oak Ridge, Tenn., U.S.) set to 10 μs shaping time, and a Tukan 8K multi-channel analyzer (National Center for Nuclear Research, Świerk, Poland). The 662 keV photopeak was fit with a Gaussian function, and percent energy resolution was calculated by dividing the full width at half maximum (FWHM) by centroid channel number. Light yield was measured using a similar setup as with energy resolution, with the primary difference being the use of a Hamamatsu R2059 PMT (Hamamatsu Photonics, K. K., Hamamatsu City, Japan) operated at 1.5 kV instead of the R6231.

Figure 2:
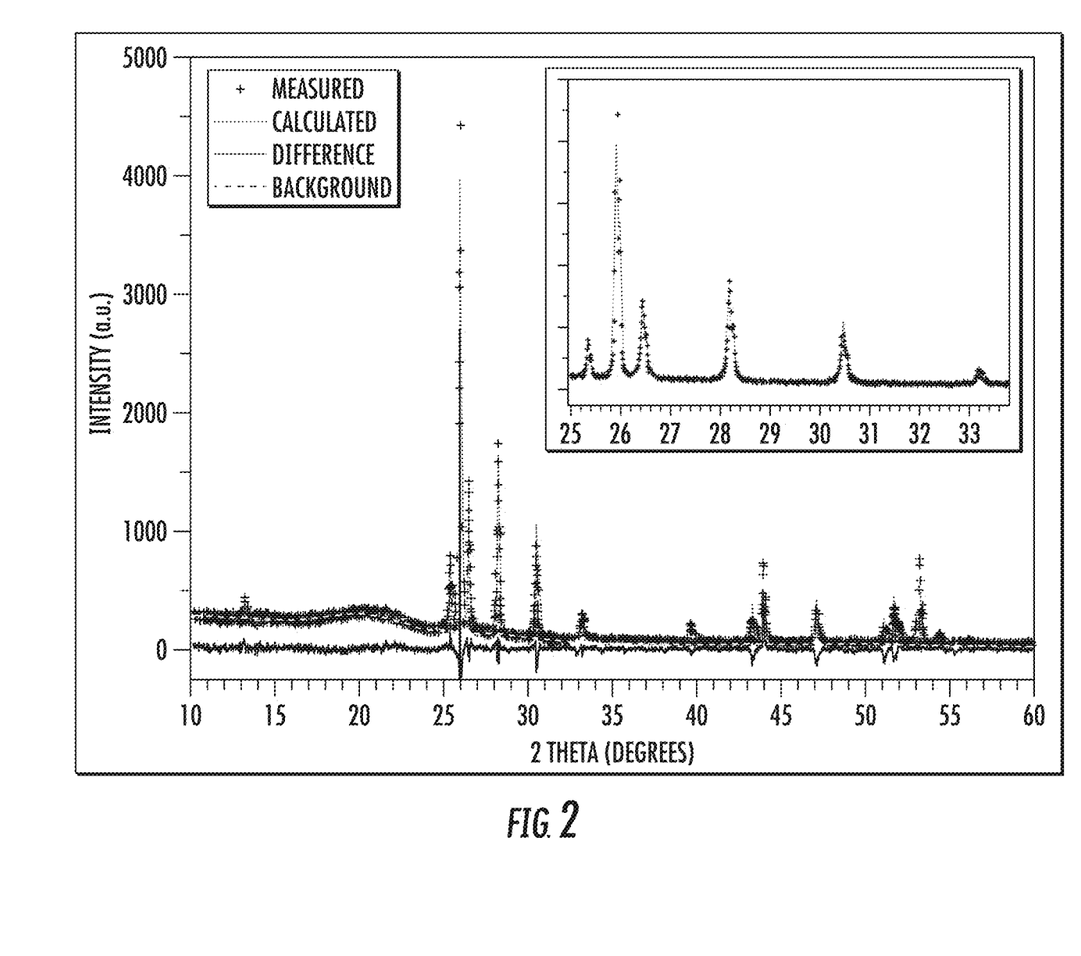
FIG. 2 is a graph showing the powder X-ray diffraction data measured for cerium-doped cesium scandium iodide ($Cs_3Sc_2I_9$:Ce 2%) plotted with the refined structural model (calculated), which confirms the $Cs_3Cr_2Cl_9$-type hexagonal crystal structure, space group P63/mmc was obtained.
Figure 3:
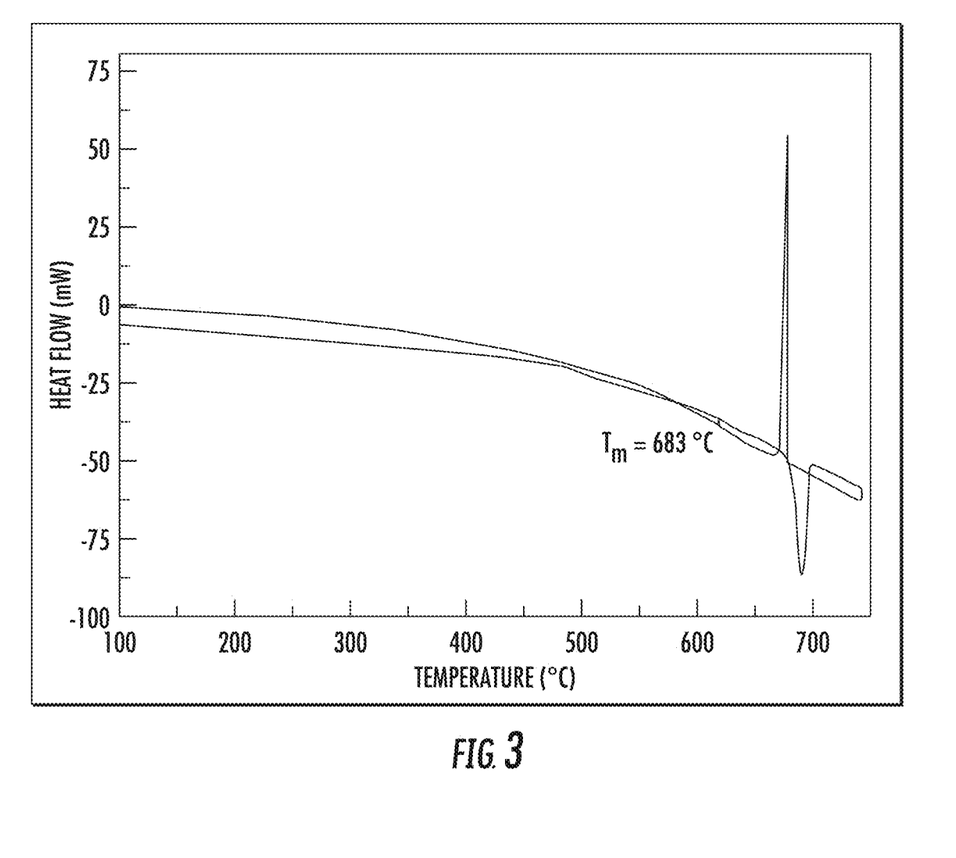
FIG. 3 is a graph showing the differential scanning calorimetry (DSC) data for cerium-doped cesium scandium iodide ($Cs_3Sc_2I_9$:Ce 2%), showing congruent melting with a melting point of 629 degrees Celsius (° C.).
Figure 4:
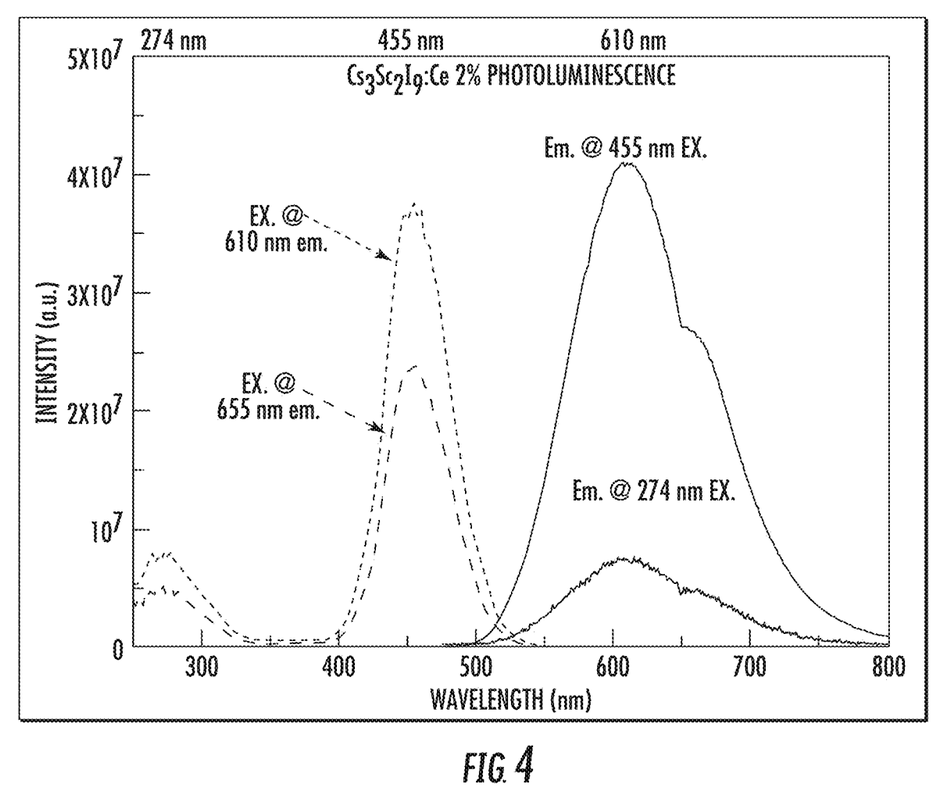
FIG. 4 is a graph showing the photoluminescence excitation (dotted lines) and emission spectra (solid lines) of cerium-doped cesium scandium iodide ($Cs_3Sc_2I_9$:Ce 2%).
Figure 5:
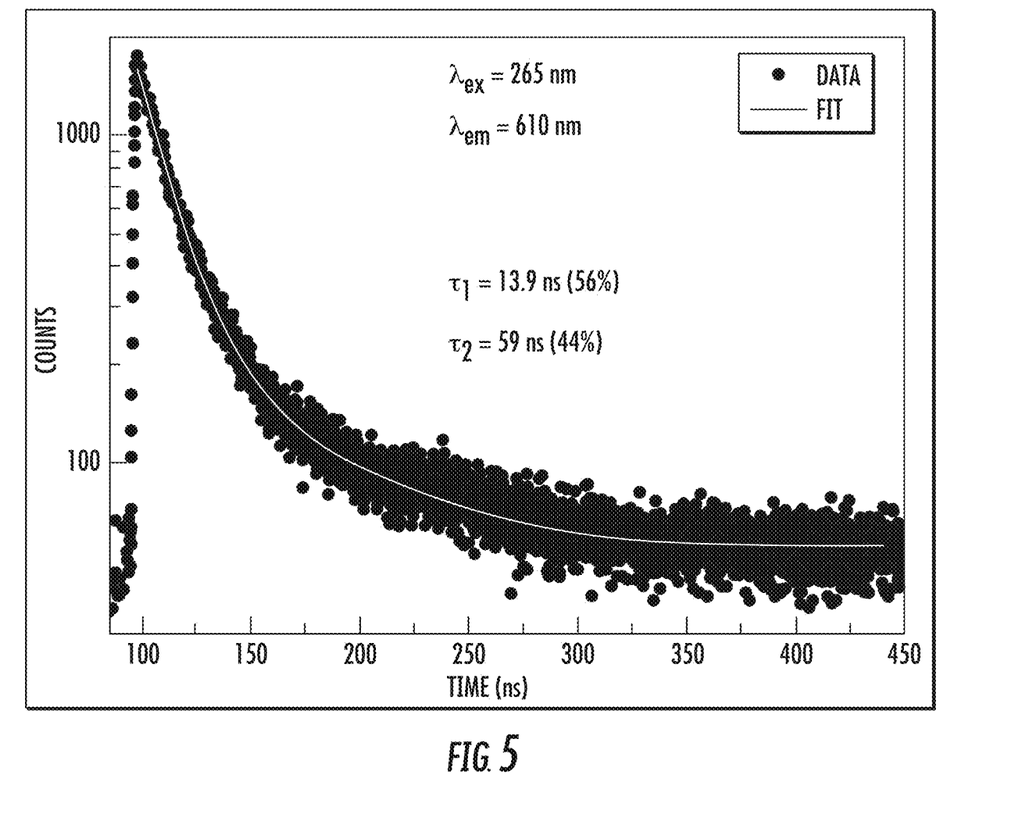
FIG. 5 is a graph showing the photoluminescence decay time of cerium-doped cesium scandium iodide ($Cs_3Sc_2I_9$:Ce 2%) excited with an excitation wavelength of 265 nanometers (nm) and monitoring emission at 610 nm.
Figure 6:
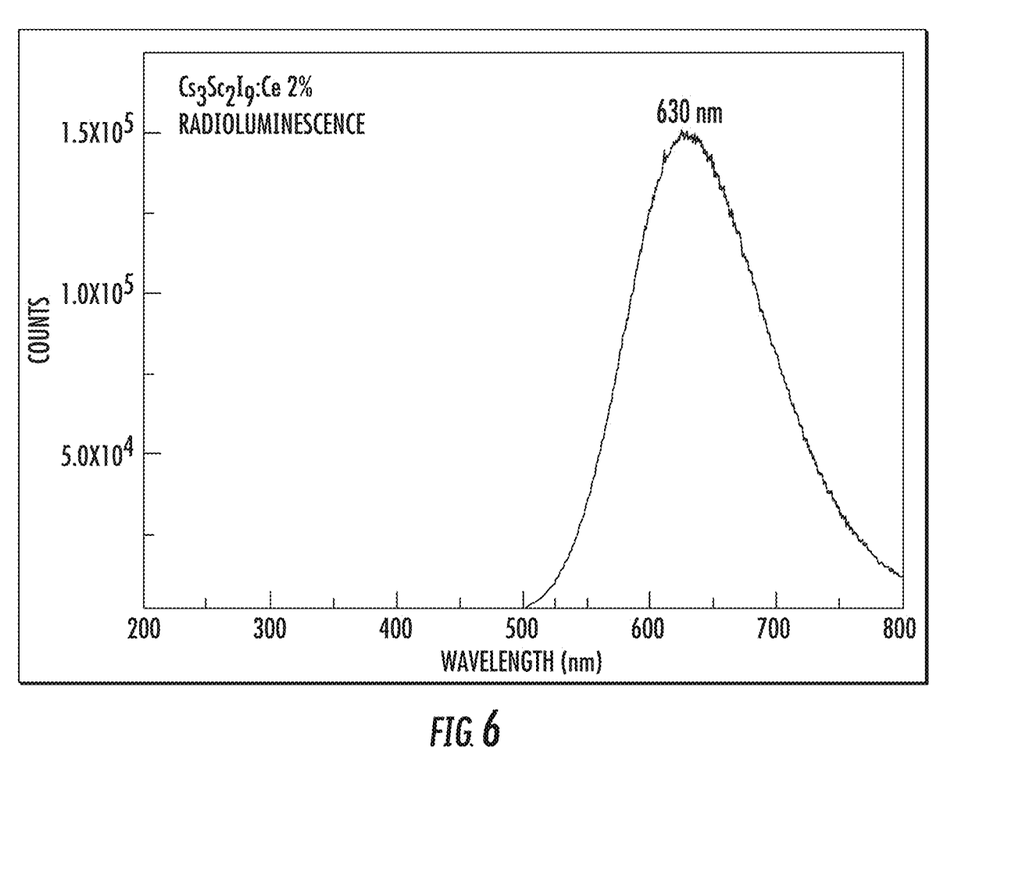
FIG. 6 is a graph showing the radioluminescence spectrum of cerium-doped cesium scandium iodide ($Cs_3Sc_2I_9$:Ce 2%).
Figure 7A:
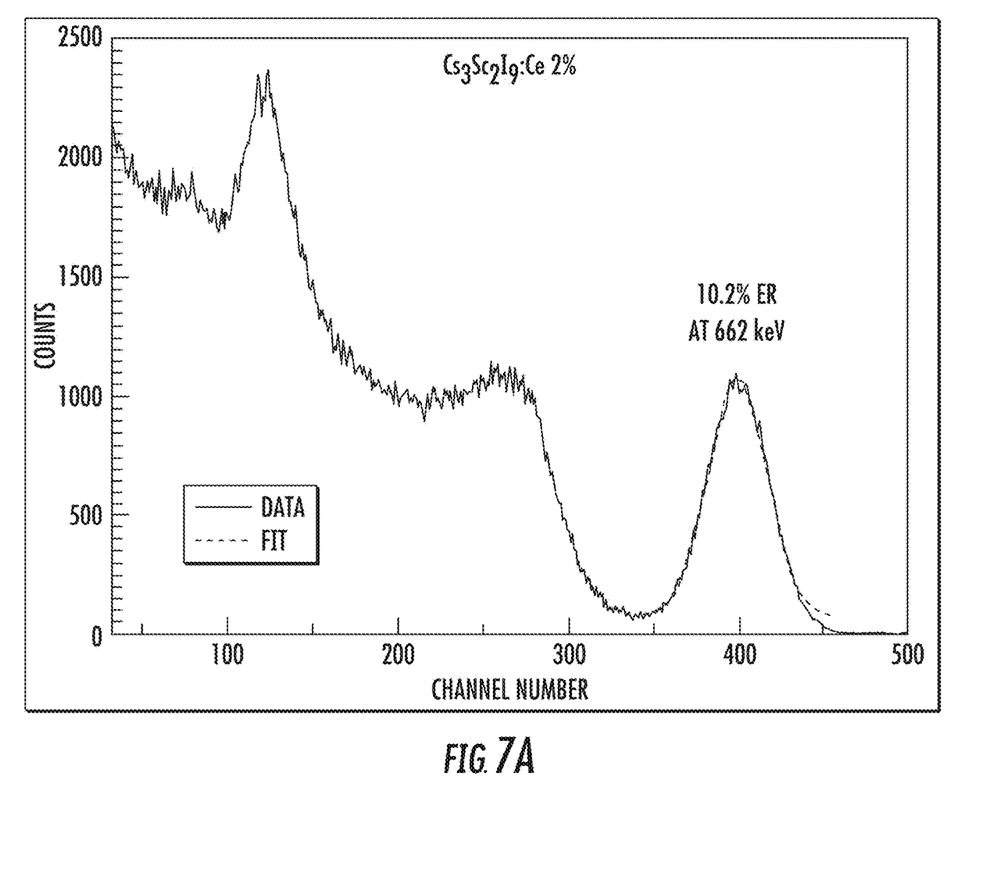
FIG. 7A is a graph showing the pulse height spectrum of cerium-doped cesium scandium iodide ($Cs_3Sc_2I_9$:Ce 2%) measured using a 662 kiloelectronvolt (keV) cesium-137 ($^{137}Cs$) source in linear scale.
Figure 7B:
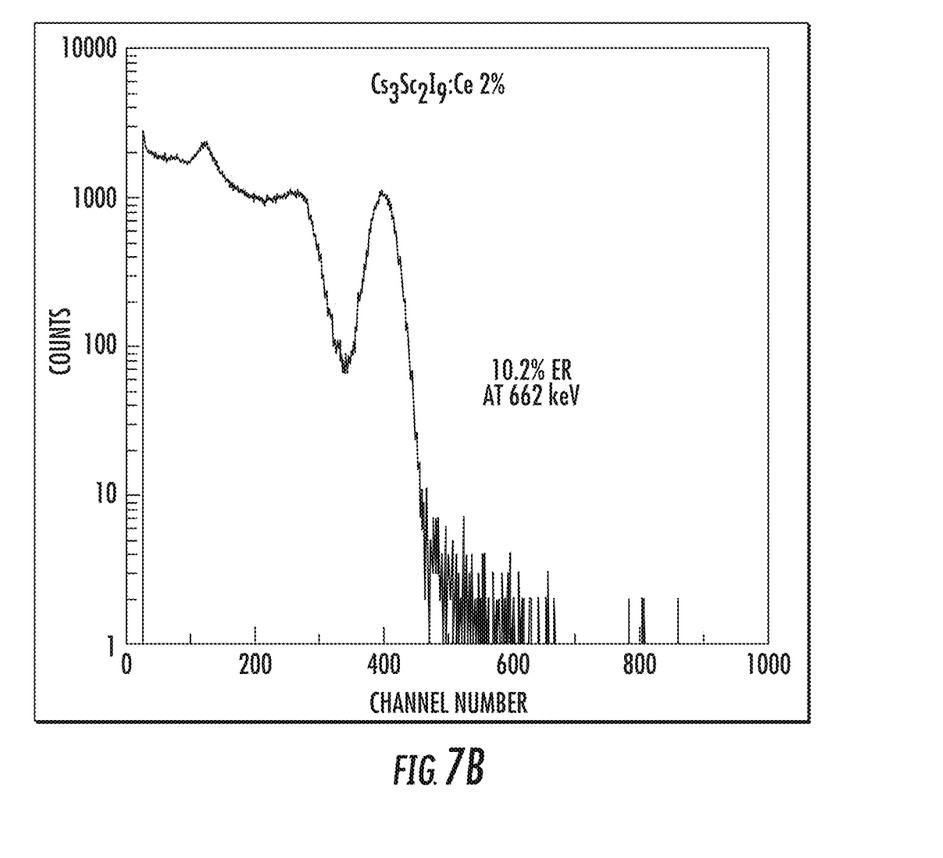
FIG. 7B is a graph showing the pulse height spectrum of cerium-doped cesium scandium iodide ($Cs_3Sc_2I_9$:Ce 2%) measured using a 662 kiloelectronvolt (keV) cesium-137 ($^{137}Cs$) source in log scale.

Discussion: Structural, thermal, luminescent, and scintillation properties of $Cs_3Sc_2I_9$:Ce 2% were determined. The material forms a single phase having the $Cs_3Cr_2Cl_9$-type hexagonal crystal structure belonging to space group P63/mmc and melts congruently at 683° C., as shown in FIGS. 2 and 3, respectively. The refined lattice parameters are a=8.2440(7) Å and c=20.6429(9) Å. Photoluminescence excitation spectra show two bands centered at ~274 nm and ~455 nm, and emission spectra are centered at ~610 nm (the feature at 650 nm is an instrumental artifact). See FIG. 4. The emission spectrum is the same regardless of which excitation band the crystal is excited with; the only change being a difference in intensity. This is also the case for excitation spectra measured while monitoring either emission band. The luminescent lifetime consists of a fast 13.9 ns component (56%) and a slower 59 ns component (44%), as seen in FIG. 5. The X-ray induced emission spectrum, or radioluminescence, ranges from 500 nm to 800 nm with peak intensity occurring at 630 nm. See FIG. 6. $Cs_3Sc_2I_9$:Ce 2% is a reasonably bright scintillator with a light yield of 28,000 ph/MeV (accounting for quantum efficiency of the bi-alkali PMT). It has an energy resolution of 10.2% at 662 keV when measured on a PMT. See FIGS. 7A and 7B.

Example 2

Additional Scintillators

Transparent Ø7 mm single crystals of undoped and 2 mol % Ce-doped $Cs_3Sc_2X_9$ (X=I, Br, or Cl) (e.g., $Cs_3Sc_2I_9$:Ce 2% and $Cs_3Sc_2Br_9$:Ce 2%) were grown using the vertical Bridgman method, and structural, luminescence, and scintillation properties were investigated. Mixed halide compositions ($Cs_3Sc_2Cl_{9-x}Br_x$:Ce and $Cs_3Sc_2Br_{9-x}I_x$:Ce) were also prepared and evaluated.

Powder X-ray diffraction revealed that the grown crystals of $Cs_3Sc_2I_9$ and $Cs_3Sc_2Br_9$ were single phase and adopt the $Cs_3Cr_2Cl_9$-type hexagonal crystal structure with space group P63/mmc. Rietveld refinement was performed resulting in refined lattice parameters of a=8.2440(7) Å and c=20.6429(9) Å for $Cs_3Sc_2I_9$ (GOF=1.93) and a=7.68226 (54) Å and c=19.25828(81) Å for $Cs_3Sc_2Br_9$(GOF=1.9). Radioluminescence emission spectra of $Cs_3Sc_2I_9$:Ce 2%, $Cs_3Sc_2Br_9$:Ce 2%, and $Cs_3Sc_2Br_3I_6$:Ce 2% were measured. The full-iodide compound provided broad emission from ~500 nm to 900 nm with peak intensity at 630 nm, whereas emission of the full-bromide compound ranged from 400 nm to 800 nm with peak intensity at 564 nm. A minimal shift from 630 nm to 623 nm was observed for $Cs_3Sc_2Br_3I_6$:Ce 2%. Light yield and energy resolution of these three crystals were measured using a standard bi-alkali photomultiplier tube (PMT). Due to the long wavelength emissions, the PMT quantum efficiencies were low (2.6% for $Cs_3Sc_2I_9$:Ce 2% and 7.9% for the $Cs_3Sc_2Br_9$:Ce 2%). $Cs_3Sc_2I_9$:Ce 2% was found to have a 10.0% energy resolution at 662 keV despite the low PMT quantum efficiency. The wavelength-corrected light yield at 662 keV is 28,000 ph/MeV. It is believed that these results can be improved by using a more red-sensitive photodetector.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. An inorganic halide having a composition of Formula (I):

wherein:
0.0≤i≤2;
0.0≤z≤2;
A is one or more monovalent cation of an element selected from the group consisting of Tl, In, Li, Na, K, Rb, and Cs;
B is one or more trivalent cation of an element selected from the group consisting of Sc, Y, La, Ce, Pr, Nd, Pm, Sm, Eu, Gd, Tb, Dy, Ho, Er, Tm, Yb, Lu, boron, Bi and Sb;
X is one or more halide selected from F, Cl, Br, and I; and
D is a dopant and D' is a codopant, wherein each of D and D' are independently a cation of an element selected from the group consisting of Mg, Ca, Sr, Ba, Zn, Zr, Hf, Sn, Au, Ag, Cu, Sc, Y, La, Ce, Pr, Nd, Pm, Sm, Eu, Gd, Tb, Dy, Ho, Er, Tm, Yb, Lu, boron, Bi and Sb, wherein D and D' are not the same cation and wherein D and D' are each different than B; and
wherein A comprises or consists of Tl$^+$ and/or X comprises a combination of at least two different halides, or
wherein the composition of Formula (I) has the formula $Cs_3Sc_{2-i}I_9$:Ce$_i$ or $Cs_3Sc_{2-i}I_9$:Pr$_i$.

2. The inorganic halide of claim 1, wherein D is a trivalent cation of an element selected from the group consisting of Sc, Y, La, Ce, Pr, Nd, Pm, Sm, Eu, Gd, Tb, Dy, Ho, Er, Tm, Yb, Lu, boron, Bi, and Sb.

3. The inorganic halide of claim 1, wherein 0.001≤i≤0.2.

4. The inorganic halide of claim 1, wherein z=0.

5. The inorganic halide of claim 1, wherein A comprises Tl$^+$ and the composition of Formula (I) has a composition of Formula (II):

wherein:
B, D, D', i and z are as defined for Formula (I);
$0.0 \leq y \leq 2.99$;
$0.0 \leq w \leq 8.99$;
A is $Tl^+$;
A' is a monovalent cation of an element selected from the group consisting of In, Li, Na, K, Rb, and Cs;
X is a halide selected from F, Cl, Br, and I; and
X' is a halide selected from F, Cl, Br, and I, subject to the proviso that X' is a different halide than X.

6. The inorganic halide of claim 5, wherein A is $Tl^+$, y=0, and the composition of Formula (II) is a composition of Formula (III):

$$Tl_3B_{2-i-z}X_{9-w}X'_w:D_iD'_z \qquad (III),$$

wherein B, X, X', D, D', i, z, and w are as defined for Formula (II).

7. The inorganic halide of claim 6, wherein B is $Sc^{3+}$.

8. The inorganic halide of claim 6, wherein D is $Ce^{3+}$ or $Pr^{3+}$.

9. The inorganic halide of claim 8, wherein i=0.04.

10. The inorganic halide of claim 6, wherein z is 0 and the inorganic halide is selected from the group consisting of $Tl_3Sc_{2-i}I_9:Ce_i$, $Tl_3Sc_{2-i}I_9:Pr_i$, $Tl_3Sc_{2-i}Br_9:Ce_i$, $Tl_3Sc_{2-i}Cl_9:Ce_i$, $Tl_3Sc_{2-i}Br_{9-w}I_w:Ce_i$, and $Tl_3Sc_{2-i}Cl_{9-w}I_w:Ce_i$, wherein $0.001 \leq i \leq 0.2$ and $1 \leq w \leq 8$.

11. The inorganic halide of claim 1, wherein X comprises two different halides selected from F, Cl, Br, and I and the composition of Formula (I) is a composition of Formula (IV):

$$AB_{2-i-z}X_{9-w}X'_w:D_iD'_z \qquad (IV),$$

wherein:
A, B, X, D, D', i, and z are as defined for Formula (I);
X' is a halide selected from F, Cl, Br, and I, subject to the proviso that X' is a different halide than X; and $1.0 \leq w \leq 8.0$.

12. The inorganic halide of claim 11, wherein A is $Cs^{3+}$.

13. The inorganic halide of claim 11, wherein B is $Sc^{2+}$.

14. The inorganic halide of claim 11, wherein X and X' are each selected from Cl, Br, and I.

15. The inorganic halide of claim 11, wherein D is selected from $Ce^{3+}$ and $Pr^{3+}$.

16. The inorganic halide of claim 11, wherein z is 0 and the inorganic halide is selected from the group consisting of $Cs_3Sc_{2-i}Br_{9-w}I_w:Ce_i$ and $Cs_3Sc_{2-i}Cl_{9-w}I_w:Ce_i$.

17. The inorganic halide of claim 16, wherein i=0.04.

18. The inorganic halide of claim 1, wherein z is 0 and the inorganic halide is $Cs_3Sc_{2-i}I_9:Ce_i$, wherein $0.001 \leq i \leq 0.2$.

19. The inorganic halide of claim 18, wherein i=0.04.

20. The inorganic halide of claim 1, wherein A comprises $Li^+$, the composition comprises a Gd cation, B comprises a trivalent boron cation; and/or X comprises Cl.

21. The inorganic halide of claim 1, wherein the composition of Formula (I) is a single crystal.

22. A radiation detector comprising a photon detector and an inorganic halide of claim 1.

23. The radiation detector of claim 22, wherein the radiation detector is a medical diagnostic device, a device for oil exploration, a surveying device, or a device for container or baggage scanning.

24. A method of detecting gamma rays, X-rays, cosmic rays and/or particles having an energy of 1 keV or greater, the method comprising using the radiation detector of claim 22.

25. A method of preparing an inorganic halide of claim 1, wherein the method comprises preparing a single crystal from molten raw materials.

26. The method of claim 25, wherein the method comprises moving a crucible containing the molten raw materials vertically through a temperature gradient from a warmer region of a furnace to a cooler region of a furnace.

27. A method of detecting neutrons, wherein the method comprising using a radiation detector comprising (i) a photon detector, and (ii) an inorganic halide having a composition of Formula (I):

$$A_3B_{2-i-z}X_9:D_iD'_z \qquad (I),$$

wherein:
$0.0 \leq i \leq 2$;
$0.0 \leq z \leq 2$;
A is one or more monovalent cation of an element selected from Tl, In, Li, Na, K, Rb, and Cs;
B is one or more trivalent cation of an element selected from the group consisting of Sc, Y, La, Ce, Pr, Nd, Pm, Sm, Eu, Gd, Tb, Dy, Ho, Er, Tm, Yb, Lu, boron, Bi and Sb;
X is one or more halide selected from F, Cl, Br, and I; and
D is a dopant and D' is a codopant, wherein each of D and D' are independently a cation of an element selected from the group consisting of Mg, Ca, Sr, Ba, Zn, Zr, Hf, Sn, Au, Ag, Cu, Sc, Y, La, Ce, Pr, Nd, Pm, Sm, Eu, Gd, Tb, Dy, Ho, Er, Tm, Yb, Lu, boron, Bi and Sb, wherein D and D' are not the same cation and wherein D and D' are each different than B;
wherein A comprises or consists of $Tl^+$ and/or X comprises a combination of at least two different halides, or wherein the composition of Formula (I) has the formula $Cs_3Sc_{2-i}I_9:Ce_i$ or $Cs_3Sc_{2-i}I_9:Pr_i$; and
wherein A comprises $Li^+$, the composition comprises a Gd cation, B comprises a trivalent boron cation; and/or X comprises Cl.

28. The method of claim 27, wherein the radiation detector is a medical diagnostic device, a device for oil exploration, a surveying device, or a device for container or baggage scanning.

* * * * *